United States Patent [19]

Main

[11] Patent Number: 4,878,031
[45] Date of Patent: Oct. 31, 1989

[54] CLASS B VARIABLE GAIN CONTROL CIRCUIT

[75] Inventor: W. Eric Main, Mesa, Ariz.

[73] Assignee: Motorola, Inc., Schaumburg, Ill.

[21] Appl. No.: 319,038

[22] Filed: Mar. 6, 1989

[51] Int. Cl.[4] .............................................. H03G 3/00
[52] U.S. Cl. .................................... 330/254; 330/257; 330/278
[58] Field of Search ................ 330/254, 257, 278, 260

[56] References Cited

U.S. PATENT DOCUMENTS 3,921,091 11/1975 Van Kessel et al. ................ 330/254

*Primary Examiner*—James B. Mullins
*Attorney, Agent, or Firm*—Michael D. Bingham

[57] ABSTRACT

A variable gain control circuit comprising an input stage and an output stage is responsive to an applied input signal for providing an output signal. The input stage and output stage are independently biased by respective bias sources and each include circuitry responsive to a dynamic control voltage, the latter of which is generated in response to the input signal, to permit the absolute magnitudes of the input signal and output signal to exceed the respective bias sources. The ratio of the output and input signals is proportional to the ratio of the bias sources.

18 Claims, 2 Drawing Sheets

CLASS B VARIABLE GAIN CONTROL CIRCUIT

BACKGROUND OF THE INVENTION

The present invention relates in general to an electronic gain control circuit and, more particularly, to a variable gain control circuit which includes a voltage reference circuit coupled to an input stage, another voltage reference circuit means coupled to an output stage, and an operational amplifier (op amp) responsive to the input signal for developing a dynamic control voltage to the input and output stages. The circuit permits the magnitude of the input signal and the output signal to exceed independent current sources within the respective voltage reference circuits.

Variable gain control circuits are used in a myriad of applications, including receivers, transmitters and high fidelity electronics, anywhere it is necessary to adjust the amplitude of a signal. Specific circuits include attenuators, volume controls, tone controls and audio mixers. A typical gain control circuit includes an input stage and an output stage connected through a common node to the output of an op amp which in turn controls the current in each of the stages. The op amp senses a particular voltage, set by the magnitude of input current, and adjusts its output voltage to compel the input stage to sink the input current. The same op amp output voltage is applied to the output stage and controls the magnitude of the output current. Thus, a particular input current results in an particular output current proportional to the ratio of the current sources within the respective input and output stages. The input and output terminals couple to current sources within the respective stages in such manner that the magnitude of the input and output currents is limited to that of the current source. Equivalently, these current sources must be sufficiently large as to handle the specifications of the input and output signals and, therefore can be unacceptable in battery applications where power consumption is an issue. Also, in high fidelity and high power applications the excessive current in the variable gain control circuit will generate noise through common impedances to other components degrading their performance.

Another gain control circuit, disclosed in U.S. Pat. No. 4225794, receives a bipolar signal, splits the positive and negative cycles, and processes the separate signals through unipolar log/anti-log amplifiers before recombining into a single bipolar format. Although this circuit may work well it can be susceptible to crossover distortion during the recombination process. Still another gain control circuit uses an input and output stage such that each stage includes a PNP transistor coupled in series with a NPN transistor operated as current sources and having an output at the interconnection of the transistors which amplifies any mismatch between the two current sources. This technique is undesirable due to the difficulty in matching the PNP and NPN transistors.

Hence, there exists a need for an improved variable gain control circuit which is not susceptible to the crossover distortion nor requires PNP to NPN transistor matching. In addition, the input and output signals should not be limited by the magnitude of current source references, indeed, the current sources should be substantially smaller than the maximum input and output signals to minimize power consumption and system noise generation.

SUMMARY OF THE INVENTION

It is therefore the subject of the present invention to provide an improved electronic gain control circuit.

A further objective of the present invention is to provide an improved variable gain control circuit having an input stage and output stage such that the magnitude of the input and output signals are not limited by the current sources coupled to the respective stages.

Still a further objective of this invention is to provide a variable gain control circuit which is not susceptible to crossover distortion.

Yet another objective of this invention is to provide a variable gain control circuit which does not require PNP to NPN transistor matching.

In accordance with the above and other objectives there is provided a variable gain control circuit comprising an input stage coupled between the input of the circuit and a first voltage reference circuit, an output stage coupled between the output of the circuit and a second voltage reference circuit, and an op amp responsive to the input signal for developing a dynamic control voltage to the input and output stages. The first and second voltage reference circuits include a first and second bias signal, respectively, for developing a reference voltage to the input and output stages. The input stage includes circuitry responsive to the input signal and the dynamic control voltage of the op amp which will permit the magnitude of the input signal to exceed the magnitude of the first bias signal. Similarly, the output stage is also responsive to the dynamic control voltage of the op amp and will allow the magnitude of the output signal to exceed the magnitude of the second bias signal. The ratio of the output and input signals is proportional to the ratio of the respective bias signals.

DETAILED DESCRIPTION OF THE PREFERRED EMBODIMENT

Figure 1:
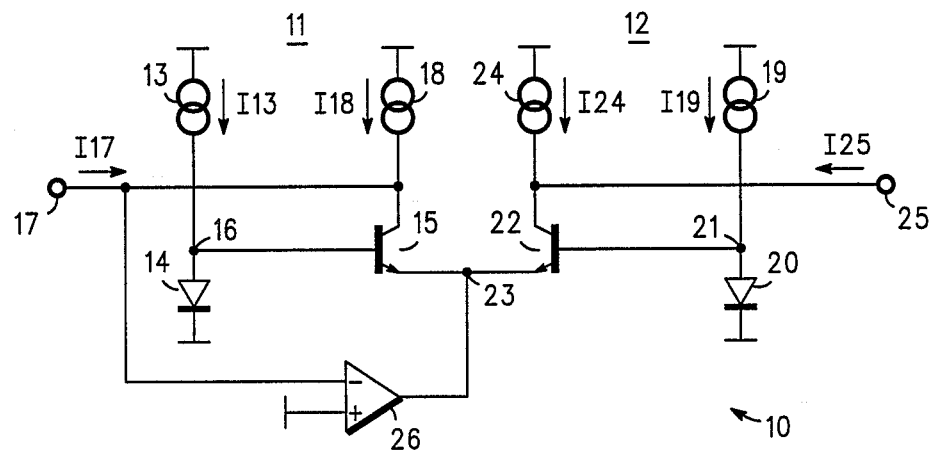
FIG. 1 is a schematic diagram illustrating a conventional variable gain circuit.

With reference to FIG. 1, a known gain control circuit 10 is shown to comprise an input stage 11 and an output stage 12 and assumes that all transistors are equal, have infinite output impedances and negligible base current. The circuit produces a current I25 at output 25 which is proportional to input current I17 based on the ratio of I24, supplied by current source 24, and I18, supplied by current source 18. Note that the ratios of I13 to I18 and I19 to I24 are equal. To simplify the explanation, it is assumed that currents I13 and I18 are identical and currents I24 and I19 are identical. It is also noted that all diodes herein may be transistors having their base and collector terminals shorted together.

Considering the embodiment of FIG. 1 in greater detail, current source 13 couples to diode 14 and provides a means to establish a reference voltage at the base of transistor 15 with respect to ground potential. Current I13, supplied by current source 13, will fix the reference voltage at node 16 to a level expressed by $V_{16}=V_t*\ln(I_{13}/I_s+1)$ which is simply the classic diode relationship $I_d=I_s*\exp(V_d/V_t-1)$ that relates the current through a PN junction ($I_d=I_{13}$) to the voltage across the junction ($V_d=V_{16}$). The inverting and non-inverting terminals of op amp 26 are coupled to input 17 and suitable bias potential, respectively. The output of op amp 26 sets the base-to-emitter voltage ($V_{be}$) of transistor 15 which adjusts the collector current thereof to match the summation of I17 and I18. In the output stage, current source 19 couples to diode 20 and establishes a reference voltage at node 21 with respect to ground potential. Transistors 22 and 15 emitters share node 23 connected to the output of op amp 26, and output 25 couples to current source 24 and the collector of transistor 22. The voltage at node 23 determines the $V_{be}$ and collector current of transistor 22. Output 25 will source or sink current I25 to satisfy the variations in the collector current of transistor 22.

In operation with zero input current I17, op amp 26 will develop a voltage at node 23 which will adjust the collector current of transistor 15 to match I18. Since I13 and I18 are assumed to be identical, the voltage across diode 14 will be the same as the $V_{be}$ of transistor 15 whereby the voltage at node 23 is positioned at ground potential. Continuing to the output stage 12, op amp 26 has now set the emitter of transistor 22 to the same ground potential as cathode of diode 20, thus the $V_{be}$ of transistor 22 will equal the voltage across diode 20. Since I19 and I24 are identical and current I19 sets the voltage across diode 20, which has been shown to be the same as $V_{be}$ of transistor 22, it can be concluded that the collector current in transistor 22 balances with I24 and no current flows in output 25. The case of zero input current I17 has resulted in zero output current I25.

Now consider the case of a finite positive input current I17. Beginning with input stage 11, an increment in I17 will increase the voltage at the inverting terminal of op amp 26 resulting in a decrease at the output of op amp 26 and increase in $V_{be}$ of transistor 15. As a resultant, the collector current of transistor 15 will be increased to equal the sum of currents I18 and I17. In output stage 12, the $V_{be}$ and collector current of transistor 22 also increase. The additional collector current is sourced by output 25. An increase in input current I17 has resulted in increase in output current I25, and it can be shown that the increase is proportional to the ratio of I24 and I18. A similar scenario can be demonstrated for negative input current; however, only current source 18 can supply I17 during the negative cycles. Hence, there is a physical limitation that the magnitude of the input current be less than I18 or equivalently, the magnitude of I18 must be larger than the maximum input specification. The same is true on the output stage 12 where the magnitude of output current I25 must be less than magnitude of I24. The requirement for larger current sources causes problems with excessive power consumption and noise generation in other circuitry.

Figure 2:
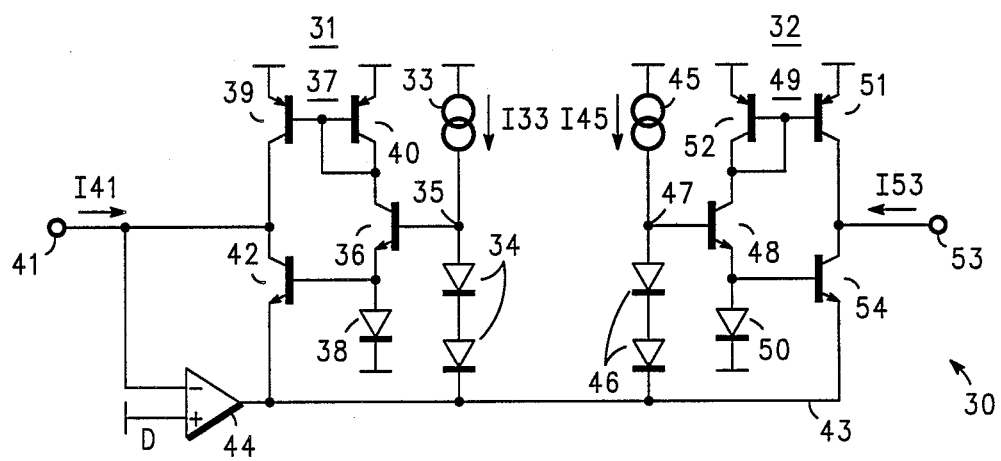
FIG. 2 is a simplified schematic diagram illustrating the preferred embodiment of the present invention.

Referring now to FIG. 2 of the present invention, variable gain control circuit 30 improves upon circuit 10 by removing the limitations on the input and output current magnitudes relative to the current sources. The circuit still assumes ideal transistors and negligible base current. Gain control circuit 30 includes input stage 31 and output stage 32 and respective voltage reference circuits. The voltage reference circuit coupled to input stage 31 includes a bias current source 33 and diode means 34. A reference voltage is developed at node 35 with respect to node 43. Within input stage 31, transistor 36 has its collector coupled to the input of current mirror 37, and its emitter coupled to the base of transistor 42 and the anode of diode means 38. The cathode of diode means 38 is coupled to ground potential. Current mirror 37 comprises an input via transistor 40 and an output at the collector of transistor 39. The action of the current mirror will enable the currents in transistors 36, 39 and 40 as well as diode means 38 to be equivalent. The collector of transistor 39 is coupled to input 41 and the collector of transistor 42. Input 41 is also coupled to the inverting terminal of op amp 44 while the non-inverting terminal is at a suitable bias potential. The output of op amp 44 couples to the emitters of transistors 42 and 54 as well as the cathodes of diode means 34 and 46. Note that the $V_{be}$ of transistor 42 plus the $V_{be}$ of transistor 36 will equal the voltage developed across diode means 34. By inspection, the currents in transistors 40 and 36 as well as diode means 38 are the same due to the isolated conduction path to ground potential. Hence, it has been shown that the currents in transistors 39, 40 and 36 as well as diode means 38 are the same.

The voltage reference circuit coupled to output stage 32 comprises a bias current source 45 and diode means 46. A reference voltage is developed at node 47 with respect to node 43. Within output stage 32, transistor 48 has its collector coupled to the input of current mirror 49 and its emitter coupled to the base of transistor 54 and the anode of diode means 50. The cathode of diode means 50 is coupled to ground potential. Current mirror 49 comprises an input via transistor 52 and an output at the collector of transistor 51. The action of the current mirror will induce the currents in transistors 48, 51 and 52 to be equivalent. The output of current mirror 49 is coupled to output 53 and to the collector of transistor 54. Output stage 32 is completed by coupling the emitter of transistor 54 to node 43. Since the emitter of transistor 54 and cathode of diode means 46 share node 43, the $V_{be}$ of transistor 54 plus the $V_{be}$ of transistor 48 will equal the voltage developed across diode means 46. By inspection, the currents in transistors 52 and 48 as well as diode means 50 are the same due to the isolated conduction path to ground potential. Hence, it has been shown that the currents in transistor 51, 52 and 48 as well as diode means 50 are the same.

The operation of gain control circuit 30 is first considered with zero input current I41. Op amp 44 will develop a voltage at node 43 which will position the $V_{be}$ of transistor 42 such that its collector will sink the output current of current mirror 37. Since the currents in diode means 38 and transistor 42 match, the $V_{be}$ of transistor 42 must equal the voltage developed across diode means 38 whereby node 43 is positioned at a voltage level equal to ground potential. A similar relationship hold true for output stage 32. The voltage across diode means 50 will equal the $V_{be}$ of transistor 54 and their currents will also be equal. With current in transistor 54 equal to the current in diode means 50 which will equal the currents in 48, 52 and 51, the currents in transistors 51 and 54 must also match, and finally there will be no contribution sourced by output 53. The case of zero input current I41 has resulted in zero output current I53. Note that the voltage developed across diode means 46 will equal the voltage across diode means 50 plus the $V_{be}$ of transistor 48, thus the current from bias current source 45 must equal the current in transistors 48, 52 and 51 under the conditions of zero input current 41. A equivalent condition holds for the input stage. Hence, the bias current sources may be selected at some arbitrarily small level independent of input/output currents within the limitations of the current gains of input/output stage transistors.

The circuit is now discussed under the conditions that input current 41 is increased to some finite positive level. Op amp 44 will sense an increased positive voltage on its inverting input terminal translating to a decrease in the voltage at node 43, and a corresponding increase in the $V_{be}$ of transistor 42 and decrease in the $V_{be}$ of transistor 36 as the sum of the $V_{be}$'s of transistors 42 and 36 must equal the voltage across diode means 34. The equivalent currents in transistors 36, 40 and 39 will decrease and will sum with the positive I41 to equal the collector current of transistor 42. The voltage decrease at node 43, applied to the output stage, will increase the $V_{be}$ of transistor 54 and decrease in the $V_{be}$ of transistor 48 as the sum of the $V_{be}$'s of transistors 54 and 48 must equal the voltage across diode means 46. The action of reducing the $V_{be}$ of transistor 48 will reduce the currents of transistors 48, 52 and 51 and motivate output 53 to source current to transistor 54 to answer its increased current requirement due to the larger $V_{be}$. The results can be shown analytically to follow the relationship $I_{41} = N^*I_{33} - I_{33}/N$ noticing that the input current may now exceed the bias current source by a factor slightly less than N, within the limitations of the current gains of the NPN transistors. The same is true for the output stage where $I_{53} = N^*I_{45} - I_{45}/N$. The same association holds for a negative input/output currents simply by changing signs.

The PNP to NPN transistor combinations of the input and output stages are not matched pairs, thus the objective to avoid PNP to NPN transistor matching has been met by the present invention. Also notice that the circuit is completely bipolar avoiding the recombination process and associated crossover distortion of other variable gain control circuits.

Another embodiment of FIG. 2, but not specifically shown, would couple the cathodes of diode means 38 and 50 to node 43, and couple the emitters of transistors 42 and 54 as well as the cathodes of diode means 34 and 46 to ground potential. Input 41 would then couple to the non-inverting terminal of op amp 44. A positive input signal would increase the node 43 voltage level causing an increase in the $V_{be}$ of transistor 42 and a decrease in the $V_{be}$ of transistor 36. The circuit would then continue to function as described in the embodiment of FIG. 2.

Figure 3:
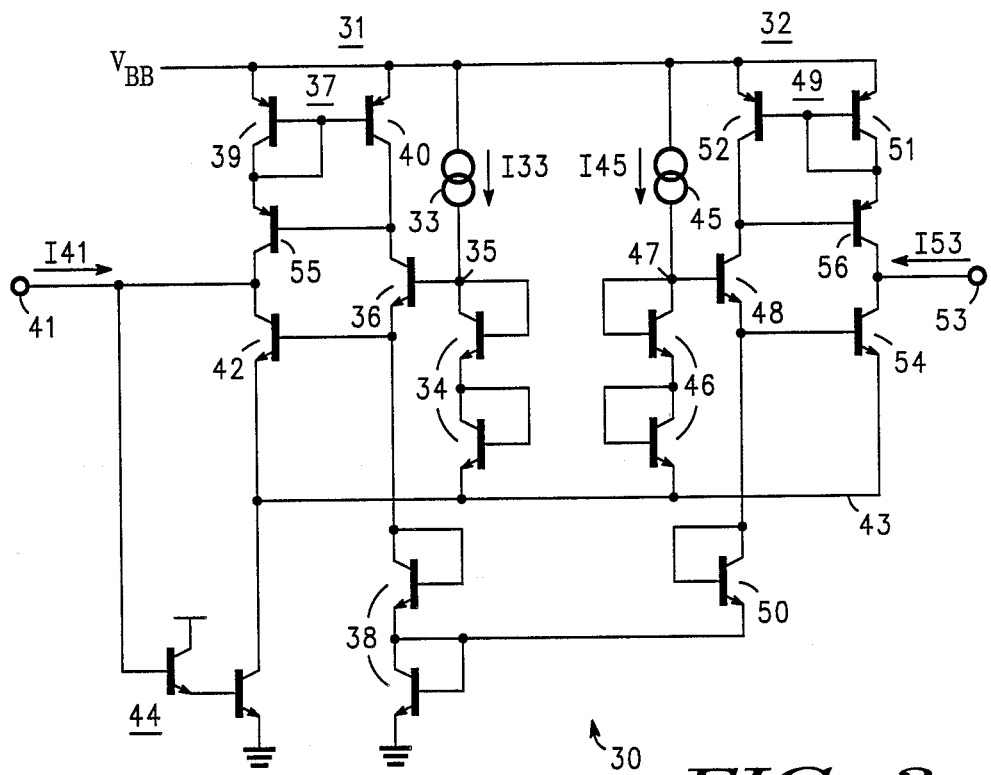
FIG. 3 is a more detailed schematic diagram of the preferred embodiment of FIG. 2.

As shown in FIG. 3 diode means 34, 46, 38 and 50 of the present invention have been replaced with NPN transistors with the base connected to the collector. Op amp 44 has been replaced with a circuit having two NPN stages with the output at the collector of the second stage. PNP transistors 55 and 56 are part of an improved current mirrors 37 and 49, respectively. The circuit elements of FIG. 3 are labeled to correspond with like circuit elements of FIG. 2. The function of the circuit is the same as described for FIG. 2.

Figure 4:
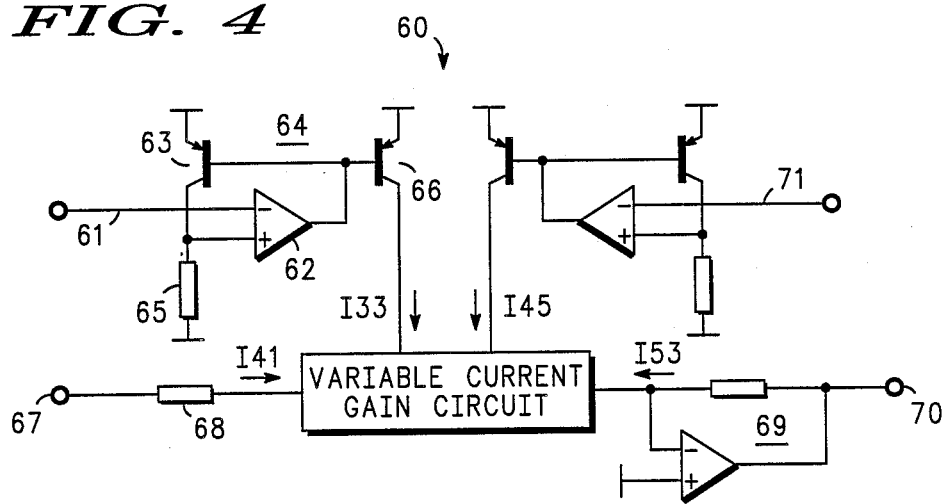
FIG. 4 shows an example of the present invention coupled to external circuitry.

In FIG. 4, the emphasis is shifted from the detailed operation of the variable gain control circuit to an implementation shown in circuit 60 where voltage sources are used rather than the current sources of FIG. 2. An input voltage is applied to node 61 to induce an output from op amp 62 such that a current is established in transistor 63 of current mirror 64 which will set the voltage across resistor 65 equal to the input voltage 61. The action of the current mirror 64 will reflect the same current in transistor 66 to form the current I33 (FIG. 2). The generation of current I45 follows an identical pattern beginning with input voltage 71. Input voltage 67 coupled to resistor 68 will source input current I41 while op amp circuit 69 is a current-to-voltage converter to transform output current I53 into output voltage 70.

What has been provided therefore is a novel variable gain control circuit providing a means for the input and output currents to exceed the magnitude of the bias current sources which in turn will control the overall gain. While there have been described above the principles of the invention in conjunction with a specific apparatus, it is clearly understood that this description is made only by way of example and is not a limitation to the scope of the invention.

I claim:

1. A gain control circuit having an input and an output, comprising:

a bias source for providing first and second bias signals;

reference means receiving said first and second bias signals for providing first and second reference voltages;

circuit means coupled to the input of the circuit responsive to an applied input signal for providing a dynamic control voltage at an output;

an input stage including circuit means responsive to said input signal and said dynamic control voltage for permitting the absolute magnitude of said input signal to exceed the magnitude of said first bias signal, said input stage coupled between said input and said reference means and being biased by said first reference voltage; and an output stage including circuit means responsive to said dynamic control voltage for providing an output signal at the output of the circuit the absolute magnitude of which may exceed the magnitude of said second bias signal, said output stage being coupled between said output and said reference means and being biased by said second reference voltage wherein the ratio of said output and input signals is proportional to the ratio of said second and first bias signals.

2. The gain control circuit of claim 1 wherein said circuit means of said input stage includes:

a first transistor having a base coupled to said reference means, an emitter and a collector; and a second transistor having a base coupled to said emitter of said first transistor, an emitter coupled to said output of said circuit means for providing a dynamic control voltage and an collector coupled to said input of the circuit.

3. The gain control circuit of claim 2 wherein said input stage includes:

a current mirror having an input coupled to said collector of said first transistor, an output coupled to said collector of said second transistor and a common terminal to which a first potential is supplied; and diode means coupled between said emitter of said first transistor and a terminal to which a second potential is supplied.

4. The gain control circuit of claim 3 wherein said circuit means of said output stage includes:

a third transistor having a base coupled to said reference means, an emitter and a collector; and a fourth transistor having a base coupled to said emitter of said third transistor, an emitter coupled to said output of said circuit means for providing a dynamic control voltage and an collector coupled to said output of the circuit.

5. The gain control circuit of claim 4 wherein said output stage includes:
   a current mirror having an input coupled to said collector of said third transistor, an output coupled to said collector of said fourth transistor and a common terminal to which said first potential is supplied; and
   additional diode means coupled between said emitter of said third transistor and a terminal to which said second potential is supplied.

6. The gain control circuit of claim 5 wherein said bias source includes a first current source for providing said first bias signal and a second current source for providing said second bias signal.

7. The gain control circuit of claim 6 wherein said reference means includes:
   at least one diode means coupled between said first current source and said output of said circuit means for providing a dynamic control voltage; and
   at least one diode means coupled between said second current source and said output of said circuit means for providing a dynamic control voltage.

8. The gain control circuit of claim 1 wherein said circuit means of said output stage includes:
   a first transistor having a base coupled to said reference means, an emitter and a collector; and
   a second transistor having a base coupled to said emitter of said first transistor, an emitter coupled to said output of said circuit means for providing a dynamic control voltage and an collector coupled to the output of the circuit.

9. The gain control circuit of claim 8 wherein said output stage includes:
   a current mirror having an input coupled to said collector of said first transistor, an output coupled to said collector of said second transistor and a common terminal to which a first potential is supplied; and
   diode means coupled between said emitter of said first transistor and a terminal to which a second potential is supplied.

10. An integrated gain control circuit having an input and an output, comprising:
    a bias source for providing first and second bias signals;
    reference means receiving said first and second bias signals for providing first and second reference voltages;
    circuit means coupled to the input of the circuit responsive to an applied input signal for providing a dynamic control voltage at an output;
    an input stage including circuit means responsive to said input signal and said dynamic control voltage for permitting the absolute magnitude of said input signal to exceed the magnitude of said first bias signal, said input stage coupled between said input and said reference means and being biased by said first reference voltage; and
    an output stage including circuit means responsive to said dynamic control voltage for providing an output signal at the output of the circuit the absolute magnitude of which may exceed the magnitude of said second bias signal, said output stage being coupled between said output and said reference means and being biased by said second reference voltage wherein the ratio of said output and input signals is proportional to the ratio of said second and first bias signals.

11. The gain control circuit of claim 10 wherein said circuit means of said input stage includes:
    a first transistor having a base coupled to said reference means, an emitter and a collector; and
    a second transistor having a base coupled to said emitter of said first transistor, an emitter coupled to said output of said circuit means for providing a dynamic control voltage and an collector coupled to said input of the circuit.

12. The gain control circuit of claim 11 wherein said input stage includes:
    a current mirror having an input coupled to said collector of said first transistor, an output coupled to said collector of said second transistor and a common terminal to which a first potential is supplied; and
    diode means coupled between said emitter of said first transistor and a terminal to which a second potential is supplied.

13. The gain control circuit of claim 12 wherein said circuit means of said output stage includes:
    a third transistor having a base coupled to said reference means, an emitter and a collector; and
    a fourth transistor having a base coupled to said emitter of said third transistor, an emitter coupled to said output of said circuit means for providing a dynamic control voltage and an collector coupled to said output of the circuit.

14. The gain control circuit of claim 13 wherein said output stage includes:
    a current mirror having an input coupled to said collector of said third transistor, an output coupled to said collector of said fourth transistor and a common terminal to which said first potential is supplied; and
    additional diode means coupled between said emitter of said third transistor and a terminal to which said second potential is supplied.

15. The gain control circuit of claim 14 wherein said bias source includes a first current source for providing said first bias signal and a second current source for providing said second bias signal.

16. The gain control circuit of claim 15 wherein said reference means includes:
    at least one diode means coupled between said first current source and said output of said circuit means for providing a dynamic control voltage; and
    at least one diode means coupled between said second current source and said output of said circuit means for providing a dynamic control voltage.

17. The gain control circuit of claim 10 wherein said circuit means of said output stage includes:
    a first transistor having a base coupled to said reference means, an emitter and a collector; and
    a second transistor having a base coupled to said emitter of said first transistor, an emitter coupled to said output of circuit means for providing a dynamic control voltage and an collector coupled to the output of the circuit.

18. The gain control circuit of claim 17 wherein said output stage includes:
    a current mirror having an input coupled to said collector of said first transistor, an output coupled to said collector of said second transistor and a common terminal to which a first potential is supplied; and
    diode means coupled between said emitter of said first transistor and a terminal to which a second potential is supplied.

* * * * *